(12) United States Patent
Pakala et al.

(10) Patent No.: US 8,559,141 B1
(45) Date of Patent: Oct. 15, 2013

(54) SPIN TUNNELING MAGNETIC ELEMENT PROMOTING FREE LAYER CRYSTAL GROWTH FROM A BARRIER LAYER INTERFACE

(75) Inventors: Mahendra Pakala, Fremont, CA (US); Chando Park, Fremont, CA (US)

(73) Assignee: Western Digital (Fremont), LLC, Fremont, CA (US)

(*) Notice: Subject to any disclaimer, the term of this patent is extended or adjusted under 35 U.S.C. 154(b) by 965 days.

(21) Appl. No.: 11/800,553

(22) Filed: May 7, 2007

(51) Int. Cl.
*G11B 5/33* (2006.01)

(52) U.S. Cl.
USPC .................................................. 360/324.2

(58) Field of Classification Search
USPC .................................................. 360/324.2
See application file for complete search history.

(56) References Cited

U.S. PATENT DOCUMENTS

| | | | |
|---|---|---|---|
| 5,764,445 A | 6/1998 | Torng et al. |
| 6,322,640 B1 | 11/2001 | Xiao et al. |
| 6,330,542 B1 | 12/2001 | Sevcik et al. |
| 6,347,049 B1 | 2/2002 | Childress et al. |
| 6,413,325 B1 | 7/2002 | Shimazawa et al. |
| 6,535,294 B1 | 3/2003 | Arledge, Jr. et al. |
| 6,680,831 B2 | 1/2004 | Hiramoto et al. |
| 6,690,163 B1 | 2/2004 | Hoshiya et al. |
| 6,717,686 B1 | 4/2004 | Farros et al. |
| 6,724,581 B2 | 4/2004 | Westwood |
| 6,751,073 B2 | 6/2004 | Hasegawa |
| 6,791,792 B2 | 9/2004 | Takahashi |
| 6,819,532 B2 | 11/2004 | Kamijo |
| 6,841,395 B2 | 1/2005 | Linn et al. |
| 6,848,169 B2 | 2/2005 | Shin et al. |
| 6,876,507 B2 | 4/2005 | Chen et al. |
| 6,937,434 B2 | 8/2005 | Takahashi |
| 7,077,929 B2 | 7/2006 | You et al. |
| 7,149,709 B1 | 12/2006 | Lopez, Jr. |
| 7,160,572 B2 | 1/2007 | Fujikata et al. |
| 7,211,340 B2 | 5/2007 | Nolan |
| 7,230,264 B2 | 6/2007 | Thean et al. |
| 7,230,265 B2 | 6/2007 | Kaiser et al. |
| 7,241,631 B2 | 7/2007 | Huai et al. |
| 7,256,971 B2 | 8/2007 | Horng et al. |
| 7,270,896 B2 | 9/2007 | Parkin |
| 7,349,187 B2 | 3/2008 | Parkin |
| 7,351,483 B2 | 4/2008 | Parkin |
| 7,423,849 B2 | 9/2008 | Gill |
| 7,443,639 B2 | 10/2008 | Parkin |
| 7,488,609 B1 | 2/2009 | Lin et al. |
| 7,495,796 B2 | 2/2009 | Keane et al. |
| 7,695,761 B1 | 4/2010 | Shen et al. |

(Continued)

OTHER PUBLICATIONS

Tsunekawa, et al., "Giant tunneling magnetoresistance effect in low-resistance CoFeB/MgO(001)lCoFeB magnetic tunnel junctions for read-head applications", Applied Physics Letters 87, 072503, 3 pages, 2005.

(Continued)

*Primary Examiner* — David D Davis

(57) ABSTRACT

A spin tunneling element includes a pinned layer, a barrier layer, and a free layer. The free layer includes a ferromagnetic layer including a ferromagnetic material that adjoins the barrier layer at a first interface. The free layer also includes a layer of amorphous material that adjoins the ferromagnetic layer at a second interface opposite the first interface. A first crystallization temperature of the ferromagnetic material at the first interface is lower than a second crystallization temperature at the second interface.

13 Claims, 4 Drawing Sheets

(56) References Cited

U.S. PATENT DOCUMENTS

| | | | |
|---|---|---|---|
| 7,751,156 | B2 | 7/2010 | Mauri et al. |
| 7,800,868 | B2 | 9/2010 | Gao et al. |
| 7,916,433 | B2 | 3/2011 | Huai et al. |
| 7,929,259 | B2 | 4/2011 | Gao et al. |
| 8,194,365 | B1 | 6/2012 | Leng et al. |
| 2002/0009616 | A1 | 1/2002 | Kamiguchi et al. |
| 2003/0179071 | A1 | 9/2003 | Hiramoto et al. |
| 2004/0056288 | A1 | 3/2004 | Fukuzumi |
| 2004/0091744 | A1 | 5/2004 | Carey et al. |
| 2004/0219772 | A1 | 11/2004 | You et al. |
| 2005/0009211 | A1 | 1/2005 | Linn et al. |
| 2005/0120544 | A1 | 6/2005 | Lam |
| 2005/0195534 | A1 | 9/2005 | Gill |
| 2006/0071287 | A1 | 4/2006 | Yuasa et al. |
| 2006/0093862 | A1 | 5/2006 | Parkin |
| 2006/0102969 | A1 | 5/2006 | Huai et al. |
| 2006/0128038 | A1 | 6/2006 | Pakala et al. |
| 2006/0141640 | A1 | 6/2006 | Huai et al. |
| 2006/0180839 | A1 | 8/2006 | Fukumoto et al. |
| 2006/0209590 | A1* | 9/2006 | Guo et al. ............ 365/158 |
| 2007/0074317 | A1 | 3/2007 | Pakala et al. |
| 2007/0111332 | A1 | 5/2007 | Zhao et al. |
| 2007/0139827 | A1 | 6/2007 | Gao et al. |
| 2007/0188945 | A1 | 8/2007 | Fuji et al. |
| 2007/0228501 | A1 | 10/2007 | Nakamura et al. |
| 2007/0243639 | A1 | 10/2007 | Pietambaram et al. |
| 2008/0030907 | A1 | 2/2008 | Nakabayashi et al. |
| 2008/0062581 | A1 | 3/2008 | Parkin |
| 2008/0080101 | A1 | 4/2008 | Mauri et al. |
| 2008/0124454 | A1 | 5/2008 | Djayaprawira et al. |
| 2008/0174921 | A1 | 7/2008 | Ikarashi et al. |
| 2008/0179699 | A1 | 7/2008 | Horng et al. |
| 2008/0299679 | A1 | 12/2008 | Zhao et al. |
| 2009/0027810 | A1 | 1/2009 | Horng et al. |
| 2009/0027813 | A1 | 1/2009 | Carey et al. |
| 2010/0073827 | A1 | 3/2010 | Zhao et al. |
| 2010/0255349 | A1 | 10/2010 | Gao et al. |

OTHER PUBLICATIONS

Read, et al., "X-ray photoemission study of CoFeB/MgO thin film bilayers", Applied Physics Letters 90, 132503, 3 pages, 2007.

Djayaprawira, et al., "230% room-temperature magnetoresistance in CoFeB/MgO/CoFeB magnetic tunnel junctions", Applied Physics Letters 86, 092502, 3 pages, 2005.

Tsunekawa, et al., "Huge Magnetoresistance and Low Junction Resistance in Magnetic Tunnel Junctions with Crystalline MgO Barrier", IEEE Transactions on Magnetics, vol. 42, No. 2, pp. 103-107, Feb. 2006.

Park, et al., "Annealing effects on structural and transport properties of rf-sputtered CoFeB/MgO/CoFeB magnetic tunnel junctions", Journal of Applied Physics 99, 08A901, 3 pages, 2006.

Park, et al., "Effect of Adjacent Layers on Crystallization and Magnetoresistance in CoFeB/MgO/CoFeB Magnetic Tunnel Junction", IEEE Transactions on Magnetics, vol. 42, No. 10, pp. 2639-2641, Oct. 2006.

Neil Smith, "Fluctuation-dissipation considerations for phenomenological damping models for ferromagnetic thin film," Journal of Applied Physics, Oct. 1, 2002, vol. 92, No. 7, pp. 3877-3885.

Jian-Gang Zhu, "Magnetization Dynamics: Thermal Driven Noise in Magnetoresistive Sensors," Handbook of Magnetism and Advanced Magnetic Material, John Wiley & Sons, Ltd., 2007, 16 pages.

S.W. Sun, et al., "Possible giant surface magnetostriction in amorphous Co76Cr4B20", J. Appl. Phys. 69 (Abstract), Apr. 15, 1991, 5218.

Office Action dated Sep. 18, 2012 from U.S. Appl. No. 13/529,181, 14 pages.

Office Action dated Mar. 14, 2013 from U.S. Appl. No. 13/529,181, 11 pages.

Burton, et al., "Atomic and Electronic Structure of the CoFeB/MgO Interface from First Principles", Applied Physics Letters 89, 142507, 4 pages, 2006.

* cited by examiner

SPIN TUNNELING MAGNETIC ELEMENT PROMOTING FREE LAYER CRYSTAL GROWTH FROM A BARRIER LAYER INTERFACE

FIELD OF THE INVENTION

The present invention relates to magnetic recording technology, and more particularly to a method and system for providing a spin tunneling element promoting free layer crystal growth from a barrier layer interface.

BACKGROUND

FIG. 1 depicts a conventional spin tunneling element 10. The conventional spin tunneling element 10 typically resides on a substrate 11 on which seed layer(s) 11 have been formed. The conventional spin tunneling element 10 includes a conventional antiferromagnetic (AFM) layer 14, a conventional pinned layer 16 having a magnetization 17, a conventional barrier layer 18, a conventional free layer 20 having a magnetization 21, and a conventional capping layer 22. In addition, analogous conventional spin tunneling elements (not shown) may include a synthetic free layer, a synthetic pinned layer, or both. A synthetic layer typically includes two ferromagnetic layers antiferromagnetically coupled through a thin conductive layer, such as a Ru layer. The magnetization 17 of the conventional pinned layer 16 is fixed, or pinned, in a particular direction, typically by an exchange-bias interaction with the AFM layer 14. However, the magnetization 21 of the free layer 20 may move, or switch, in response to an external field.

Such a conventional spin tunneling element 10 can be used as a sensor in tunneling magnetoresistive heads. In such an application, the magnetization 21 of the free layer 20 changes in response to an external field. The change in the magnetization 21 results in a different resistance of the conventional spin tunneling element 10. When the magnetization 21 of the conventional free layer 20 is parallel to the magnetization 17 of the conventional pinned layer 16, the resistance of the conventional spin tunneling element 10 is at a minimum. When the magnetization 21 of the conventional free layer 20 is antiparallel to the magnetization 17 of the conventional pinned layer 16, the resistance of the conventional spin tunneling element 10 is at a maximum. Consequently, the change in the magnetization 21, and thus data in a recording media (not shown), may be determined based on the resistance of the conventional spin tunneling element 10.

To be suitable for use as a sensor in a read head, the conventional spin tunneling 10 is desired to have certain properties. A large percentage change in resistance ($\Delta R/R$) and an appropriate Ra is desired for a large signal. The free layer 20 is desired to be soft, having a coercivity of not more than five Oersted. In addition, a low magnetostriction of $\lambda_s$ being not more than $1.0 \times 10^{-6}$ (or not less than $-1.0 \times 10^{-6}$) is desired. In addition, a low interlayer exchange coupling, $H_{in}$, of not more than fifty Oersted is desired to help ensure that the magnetization of the free layer 20 is free to respond to an external field.

The conventional spin tunneling element 10 may use crystalline MgO as the conventional barrier layer 18 and CoFeB for the free layer 20. For such conventional spin tunneling elements 10, the high $\Delta R/R$ and low Ra may be achieved if the MgO has a [100] texture. As used herein, a specific texture indicates that the layer has a dominant orientation. Thus, the conventional barrier layer 18 of MgO having a [100] texture means that the conventional barrier layer 18 has a dominant [100] orientation. However, for such a conventional spin tunneling element 10, the CoFeB free layer 20 may have poor soft magnetic performance. In particular, the CoFeB free layer 20 may exhibit high magnetostriction, high coercivity, and high anisotropy field. For example, the CoFeB free layer 20 may have a magnetostriction of greater than $4.5 \times 10^{-6}$. Consequently, a head using the conventional spin tunneling element 10 may not be sufficiently stable.

Alternatively, the conventional free layer 20 may be a bilayer of CoFeB and NiFe. The NiFe layer is used to improve the soft magnetic performance of the conventional free layer 18. However the use of such a multilayer for the conventional free layer 18 significantly reduces the $\Delta R/R$, and thus the signal. For example, the magnetoresistance may drop from approximately 120% to approximately 45%. When NiFe is added to CoFeB during fabrication, CoFeB is transformed from an amorphous structure to a face-centered cubic (FCC) structure during annealing of the conventional free layer 20. This change in the CoFeB layer results in a lower magnetoresistance. Consequently, the signal in a head using such a conventional free layer 20 is reduced.

Accordingly, what is needed is an improved system and method for providing a spin tunneling element that may be suitable for use in a read head.

SUMMARY

A spin tunneling element includes a pinned layer, a barrier layer, and a free layer. The free layer includes a ferromagnetic layer including a ferromagnetic material that adjoins the barrier layer at a first interface. The free layer also includes a layer of amorphous material that adjoins the ferromagnetic layer at a second interface opposite the first interface. A first crystallization temperature of the ferromagnetic material at the first interface is lower than a second crystallization temperature at the second interface.

DETAILED DESCRIPTION OF THE PREFERRED EMBODIMENTS

Figure 1:
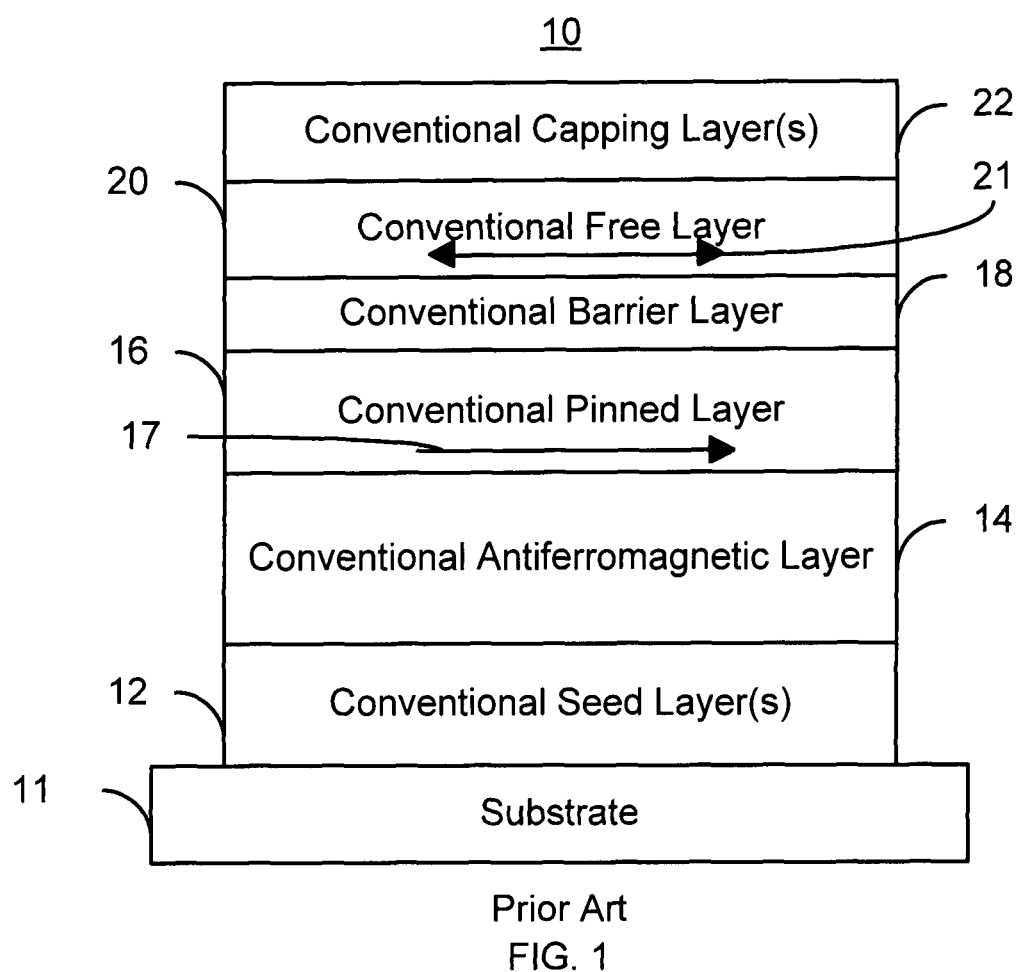
FIG. 1 depicts a conventional method 10 for fabricating a magnetoresistive device.
Figure 2:
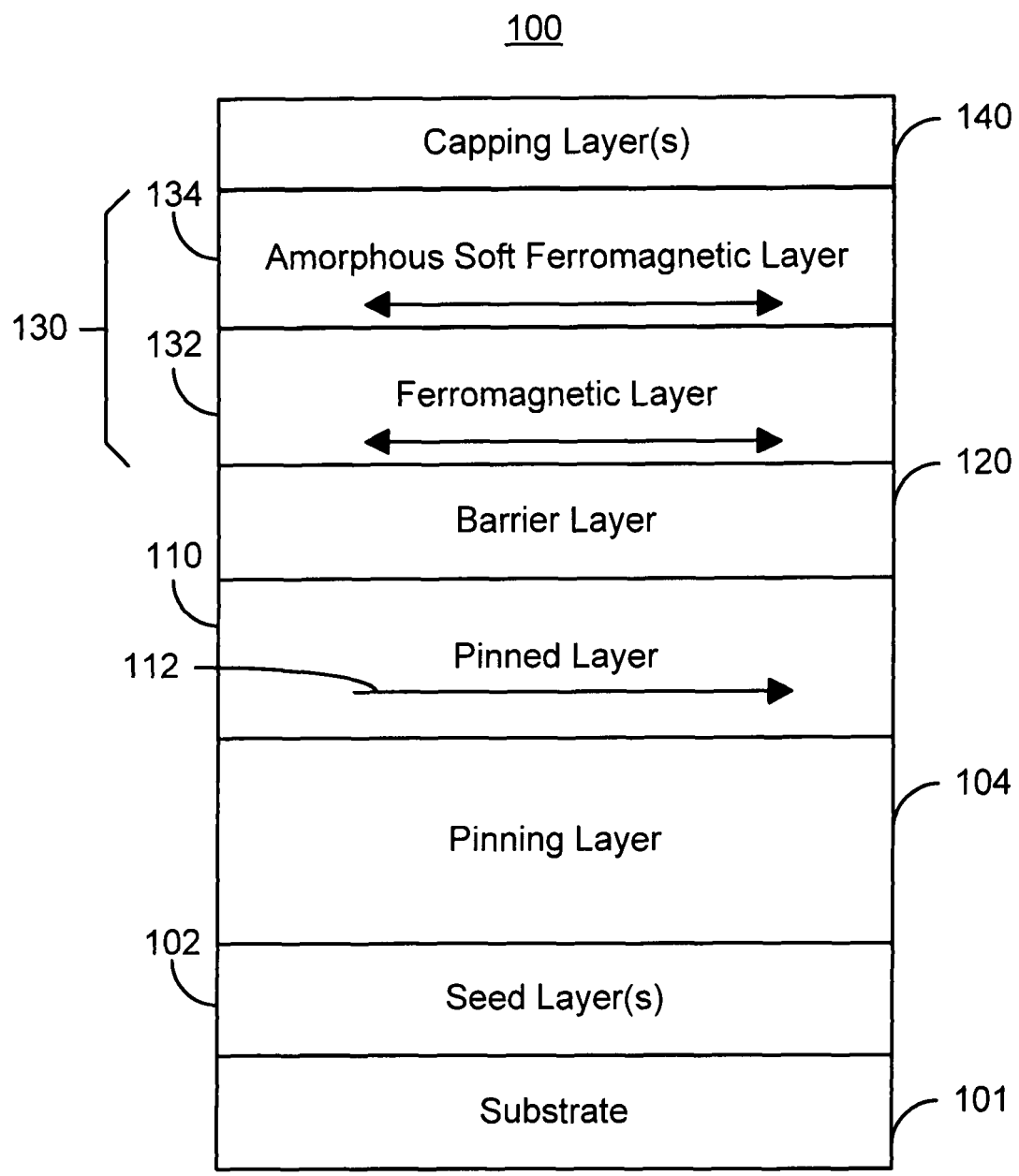
FIG. 2 is a diagram depicting an exemplary embodiment of a spin tunneling element.

FIG. 2 is a diagram depicting an exemplary embodiment of a spin tunneling element 100. The spin tunneling element 100 includes at least a pinned layer 110, a barrier layer 120, and a free layer 130. In a preferred embodiment, the magnetization 112 of the pinned layer 110 is relatively fixed, or pinned, in place using a pinning layer 104. The pinning layer 104 is preferably an antiferromagnetic layer grown on seed layer(s) 102. Also depicted in FIG. 2 is the substrate 101 and optional capping layer 140. The spin tunneling element 100 is preferably part of a transducer in a head that may be a read head or merged head.

The pinned layer 110 is preferably formed of CoFeB. However, other materials may be used. In addition, the pinned layer 110 is depicted as a single layer. However, in another embodiment, multiple layers may be used. For example, the pinned layer 100 may be a synthetic pinned layer including two ferromagnetic layers separated by a nonmagnetic spacer layer.

The barrier layer 120 is a layer through which charge carriers may tunnel. For example, the barrier layer 120 may be an insulator and/or may selectively allow tunneling of charge carriers based upon the spin state of the charge carriers. The barrier layer 120 is also crystalline and has a texture. Thus, as depicted in FIG. 2, the barrier layer 120 has a particular crystal structure and a particular texture. As used herein a crystal structure means that a majority (more than half) of the layer has the crystal structure. For example, stating that a layer is face-centered cubic (FCC) means that a majority of the layer is FCC. The entire layer need not be FCC. Similarly, as used herein a texture means that a particular orientation is dominant for the layer. For example, stating that a layer has a [100] texture means that the dominant orientation for the layer is a (100) orientation. In a preferred embodiment, the barrier layer 120 includes MgO. For example, the barrier layer 120 may be MgO or MgOX, where X is a nonmagnetic material. Such a layer may be fabricated by including a nonmagnetic underlayer (not shown) and/or capping layer (not shown). For example, an Mg underlayer and/or capping layer may be utilized in conjunction with an MgO layer. In addition, X may also include dopants such as nitrogen. Also in a preferred embodiment, the MgO is body-centered cubic (BCC) in structure and has a [100] or [200] texture.

The free layer 130 includes two layers 132 and 134. The layers 132 and 134 are preferably ferromagnetic, adjacent, and magnetically coupled. The ferromagnetic layer 132 closest to the barrier layer 120 at least partially shares the first crystal structure and first texture of the barrier layer 120 near an interface between the barrier layer 120 and the ferromagnetic layer 132. Thus, for an MgO barrier layer 120, the ferromagnetic layer 132 is preferably at least partially BCC in structure and has a [100] texture. The ferromagnetic layer 132 preferably includes CoFe. In a preferred embodiment, the ferromagnetic layer 132 is a CoFeB layer, with B having a concentration of at least ten and not more than fifty atomic percent. In a preferred embodiment, the ferromagnetic layer 132 has approximately thirty atomic percent B. The CoFe preferably has a 1:1 to 3:1 ratio of Co to Fe. For example, the ferromagnetic layer may be $Co_{40}Fe_{40}B_{20}$ or $Co_{60}Fe_{20}B_{20}$. However, in another embodiment, the ferromagnetic layer 132 may include other materials. For example, in one embodiment, the ferromagnetic layer 132 includes doped CoFeB doped with other impurities. Because CoFeB is preferred, the ferromagnetic layer 132 is hereinafter termed the CoFeB layer 132.

The adjacent ferromagnetic layer 134 is an amorphous ferromagnetic material that is magnetically softer than the CoFeB layer 132. Also in a preferred embodiment, the ferromagnetic layer 134 includes NiFe. In a preferred embodiment, the NiFe in the ferromagnetic layer 134 has less than fifty atomic percent Fe. In a more preferred embodiment, the NiFe has at least three atomic percent and not more than twenty-seven atomic percent Fe. In another embodiment, the ferromagnetic layer 134 may include other soft magnetic materials. For example, the ferromagnetic layer 134 may include NiFeX, where X includes at least one of Cr, Rh, Ru, and Nb. However, because NiFe is preferred, the ferromagnetic layer 134 is hereinafter termed the NiFe layer 134.

The NiFe layer 134 is utilized to improve the soft magnetic properties of the CoFeB layer 132. Because of the interaction with the NiFe layer 134, the CoFeB layer 132 may have sufficient soft magnetic properties. In a particular embodiment, a coercivity of not more than ten Oersted and a low magnetostriction $\lambda_s$ of not more than $1.0\times10^{-6}$ (or, depending on the magnetic field direction, not less than $-1.0\times10^{-6}$) may be achieved. Consequently, the spin tunneling element 100 may be suitable for use in a read head.

Because the NiFe layer 134 is amorphous, a first crystallization temperature at a first interface between the CoFeB layer 132 and the NiFe layer 134 is higher than a second crystallization temperature at a second interface between the CoFeB layer 132 and the barrier layer 120. Then tends to promote crystal growth from the interface between the CoFeB layer 132 and the barrier layer 120, so that there will be a significant amount of crystal growth in the BCC phase near the interface with the barrier layer 120, particularly with a [100] texture. Consequently, magnetoresistance for the spin tunneling element 100 may remain large. If the spin tunneling element 100 is utilized as a read sensor in a transducer, a high signal may be provided.

Figure 3:
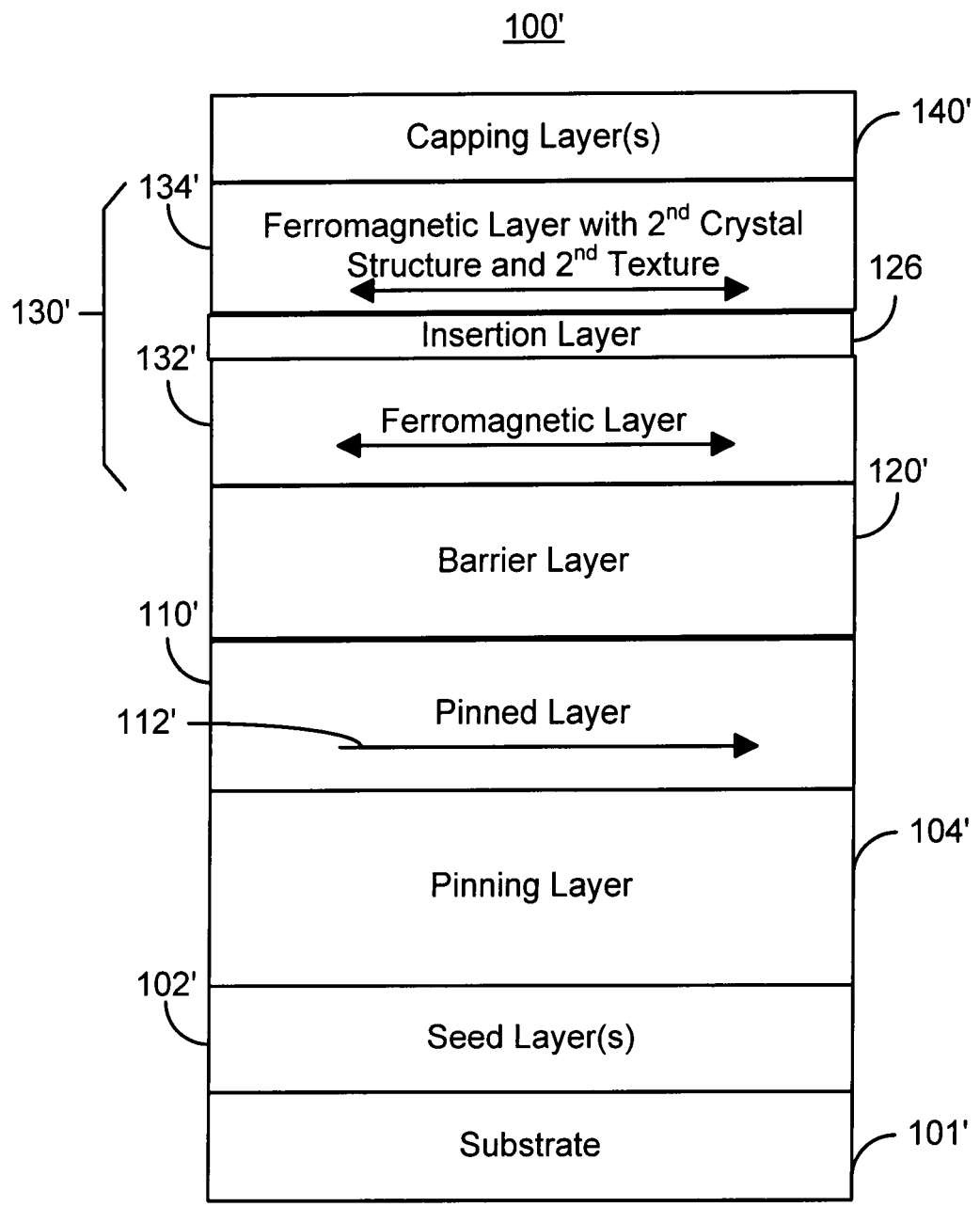
FIG. 3 is a diagram depicting another exemplary embodiment of a spin tunneling element.

FIG. 3 is a diagram depicting another exemplary embodiment of a spin tunneling element 100'. The spin tunneling element 100' is analogous to the spin tunneling element 100. Consequently, the components depicted are labeled similarly. The spin tunneling element 100' thus includes a pinning layer 104' on seed layers 102' and substrate 101', a pinned layer 110', a barrier layer 120', a free layer 130', and an optional capping layer 140'. The pinned layer 110' is depicted as a single layer, but might include multiple layers. The pinned layer 110' preferably includes a CoFeB layer. The free layer 130' includes ferromagnetic layers 132' and 134' of similar materials as the ones described in layers 132 and 134, but in the depicted embodiment, layer 134' may be crystalline. Thus, for example, ferromagnetic layer 134' may be NiFe having a FCC crystal structure. Layers 132' and 134' are separated by a thin metallic insertion layer 126. The insertion layer 126 may include an amorphous material such as Ta, Pt, Ru, Cr, or other suitable amorphous material. In alternative embodiments, the insertion layer 126 may be a crystalline metal. In a preferred embodiment, a thickness of the insertion layer 126 may be less than 6 Angstroms.

The inclusion of the insertion layer 126 makes a first crystallization temperature at a first interface between the ferromagnetic layer 132' and the insertion later 126 higher than a second crystallization temperature at a second interface between the ferromagnetic layer 132' and the barrier layer 120'. This tends to promote crystal growth in the layer 132' with a crystal structure and texture matching that of the barrier layer 120'. The ferromagnetic layer 132' thus preferably has a BCC crystal structure and a [100] texture. In one embodiment, the ferromagnetic layer 132' includes CoFe. In a preferred embodiment, the ferromagnetic layer 132' is a CoFeB layer.

The magnetic element 100' shares the benefits of the magnetic element 100. In particular, the magnetic element 100' may have improved soft properties of the free layer 130' without substantially reducing magnetoresistance.

Figure 4:
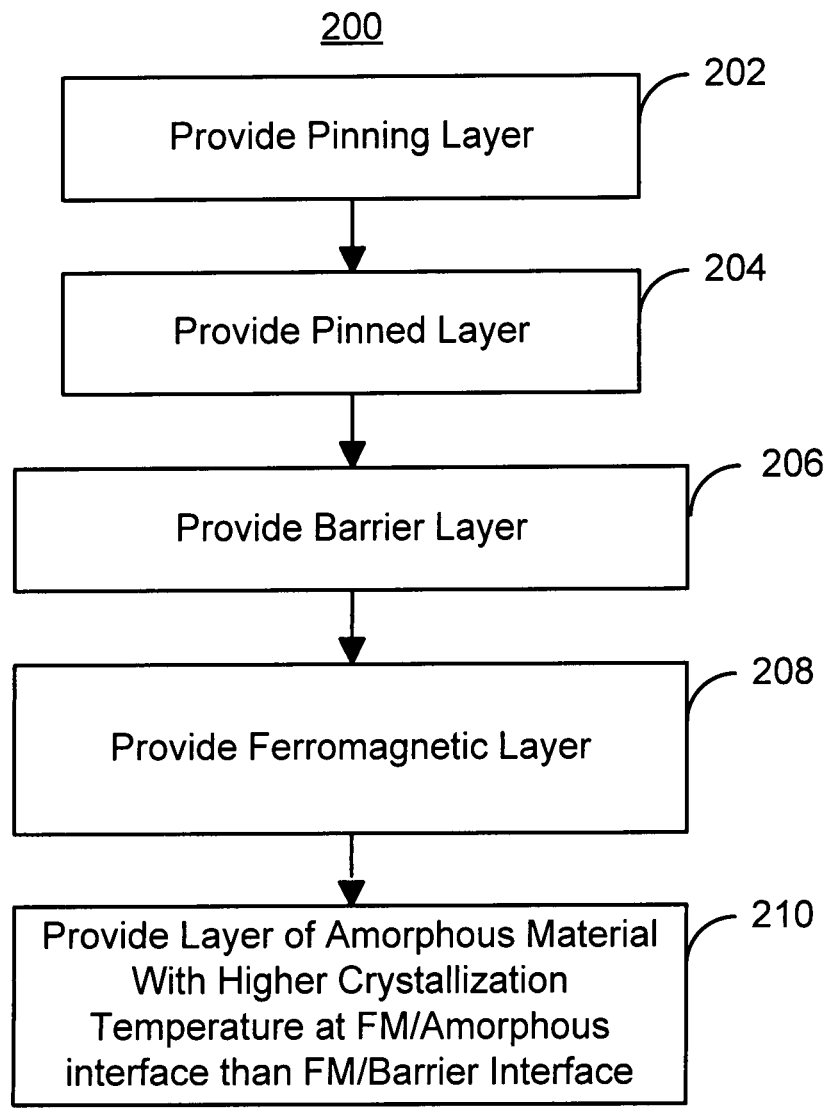
FIG. 4 is a flow chart depicting an exemplary embodiment of a method for fabricating a spin tunneling element.

FIG. 4 is a flow chart depicting an exemplary embodiment of a method 200 for fabricating a spin tunneling element. For clarity, the method 200 is described in the context of the spin tunneling element 100. However, one of ordinary skill in the art will readily recognize that the method 200 could be used to provide other spin tunneling elements including, but not limited to, the spin tunneling elements 100 or 100'. In addition, for simplicity, the method 200 is described in the context of steps having a particular order. One of ordinary skill in the art will recognize that the steps could include multiple sub-steps, the steps might be performed in another order, and that additional and/or different steps not inconsistent with the method, system, and spin tunneling elements described herein could be used.

The pinning layer 104 is provided, via step 202. In one embodiment, step 202 includes depositing an AFM layer and annealing the AFM layer in a field having a desired direction and magnitude. In a preferred embodiment, the pinning layer 104 is provided on seed layer(s) 102, which help to ensure the pinning layer 104 has the desired crystal structure and properties. The pinned layer 110 is provided, via step 204. In one embodiment, step 204 includes depositing a CoFe layer. The crystalline barrier layer 120 having the desired texture is provided, via step 206. Step 206 preferably includes depositing an MgO layer that has a [100] texture. Steps 208 and 210 are used to provide the free layer 130. The first ferromagnetic layer 132 is provided, via step 208. Step 208 preferably includes depositing a CoFe layer 132 on the underlying barrier layer 120.

In step 210, a layer of amorphous material is provided such that there is a higher crystallization temperature at an interface between the layer of amorphous material and the ferromagnetic layer 132. In one embodiment of method 200 used to provide spin tunneling element 100, for example, the layer of amorphous material may be an amorphous soft magnetic layer 134. In another embodiment of method 200 used to provide spin tunneling element 100', the layer of amorphous material may be a thin insertion layer 126, and a soft ferromagnetic layer 134' may be deposited on the insertion layer 126. In such embodiments, the higher crystallization temperature at the ferromagnetic/amorphous interface encourages crystal growth from the ferromagnetic/barrier interface when the spin tunneling element 100/100' is heated. This facilitates substantial growth of crystals in the ferromagnetic layer 132/132' with the same phase and texture as the barrier layer 120', which may improve the performance of the spin tunneling element thus provided. In alternative embodiments of the method 200, a thin metallic insertion layer 126 of crystalline metal may be substituted for the layer of amorphous material.

We claim:

1. A spin tunneling element, comprising:
a pinned layer;
a barrier layer;
a free layer, comprising:
a ferromagnetic layer comprising a ferromagnetic material adjoining the barrier layer at a first interface, the ferromagnetic layer being a first ferromagnetic layer comprising the first ferromagnetic material;
a layer of amorphous material adjoining the ferromagnetic layer at a second interface opposite the first interface, wherein a first crystallization temperature of the ferromagnetic material at the first interface is lower than a second crystallization temperature at the second interface; and
a second ferromagnetic layer distinct from the layer of amorphous material and comprising a second ferromagnetic material magnetically softer than the first ferromagnetic material, the layer of amorphous material residing between the first ferromagnetic layer and the second ferromagnet layer.

2. The spin tunneling element of claim 1, wherein the amorphous material comprises a material selected from the group consisting of: Ru, Ta, Cr, and Pt.

3. The spin tunneling element of claim 1, wherein the layer of amorphous material has a thickness of greater than zero and less than 6 Angstroms.

4. The spin tunneling element of claim 1, wherein:
the ferromagnetic layer is a first ferromagnetic layer comprising a first ferromagnetic material;
the layer of amorphous material comprises a second ferromagnetic material magnetically softer than the first ferromagnetic material.

5. The spin tunneling element of claim 4, wherein the second ferromagnetic material is a metal alloy.

6. The spin tunneling element of claim 5, wherein the second ferromagnetic material includes NiFeX, wherein X includes at least one of B and another nonmagnetic material.

7. The spin tunneling element of claim 1, wherein the barrier layer includes MgO.

8. The spin tunneling element of claim 7, wherein the barrier layer includes MgOX, wherein X is a nonmagnetic material.

9. The spin tunneling element of claim 7, wherein the barrier layer has a BCC crystal structure with a [100] texture.

10. The spin tunneling element of claim 7, wherein the ferromagnetic material includes CoFe.

11. The spin tunneling element of claim 10, wherein the ferromagnetic material includes CoFeX, wherein X includes is a nonmagnetic material.

12. The spin tunneling element of claim 11, wherein X is B.

13. A spin tunneling element, comprising:
a pinned layer;
a barrier layer;
a free layer, comprising:
a ferromagnetic layer comprising a ferromagnetic material adjoining the barrier layer at a first interface; and
a layer of amorphous material adjoining the ferromagnetic layer at a second interface opposite the first interface, wherein a first crystallization temperature of the ferromagnetic material at the first interface is lower than a second crystallization temperature at the second interface, wherein the ferromagnetic layer is a first ferromagnetic layer; and
the free layer further comprises a second ferromagnetic layer distinct from the layer of amorphous material, the layer of amorphous material being nonmagnetic and residing between the first ferromagnetic layer and the second ferromagnet layer.

* * * * *